United States Patent [19]
Ogawa et al.

[11] Patent Number: 5,349,595
[45] Date of Patent: Sep. 20, 1994

[54] DRIVE CIRCUIT FOR SEMICONDUCTOR LIGHT-EMITTING DEVICE

[75] Inventors: Katsuhisa Ogawa, Machida; Takamasa Sakuragi, Hiratsuka, both of Japan

[73] Assignee: Canon Kabushiki Kaisha, Tokyo, Japan

[21] Appl. No.: 23,358

[22] Filed: Feb. 26, 1993

[30] Foreign Application Priority Data

Feb. 28, 1992 [JP] Japan ................. 4-043880

[51] Int. Cl.⁵ ................................ H01S 3/00
[52] U.S. Cl. ........................... 372/38; 372/25; 372/29; 372/30; 372/31
[58] Field of Search ............ 372/38, 25, 29, 30, 372/31

[56] References Cited

U.S. PATENT DOCUMENTS

| | | | |
|---|---|---|---|
| 4,748,633 | 5/1988 | Negishi | 372/38 |
| 4,809,286 | 2/1989 | Kollanyi et al. | 372/38 |
| 4,817,097 | 3/1989 | Dufour | 372/38 |
| 4,835,780 | 5/1989 | Sugimura et al. | 372/29 |
| 5,115,147 | 5/1992 | Kusano et al. | 372/38 |
| 5,182,756 | 1/1993 | Waki et al. | 372/38 |

FOREIGN PATENT DOCUMENTS

A0262713 4/1988 European Pat. Off. .

OTHER PUBLICATIONS

"GaAs MESFET Laser-Driver IC for 1.7Gbit/s Lightwave Transmitter" by F. S. Chen et al.; Journal of Lightwave Technology; Mar. 1988, vol. 6, No. 3, New York USA; pp. 475–479.

"Design of a Silicon Bipolar Laser-and Line-Driver IC with Adjustable Pulse Shape and Amplitude for Data Rates Around and Above 10 Gbit/s" by H. M. Rein; Frequenz; Jan. 1992, vol. 46; No. ½, Berlin De pp. 31–37.

*Primary Examiner*—Georgia Y. Epps
*Attorney, Agent, or Firm*—Fitzpatrick, Cella, Harper & Scinto

[57] ABSTRACT

A drive circuit for supplying a constant drive current to the anode terminal of a semiconductor light emitting device, includes a current supply source connected to the anode terminal for supplying a bias current to the semiconductor light emitting device. Since the drive circuit is formed so as to supply the bias current to the anode terminal of the semiconductor light emitting device, a charge current for charging a conjunction capacitance can be reduced independently on the time period of turning off the semiconductor light emitting device. As a result, a spike noise can be removed in the laser current waveform at its rise-up part, and a reduction of its rise-up speed can be restricted, both of which are due to a dependent upon the time period of turning off the semiconductor device.

16 Claims, 10 Drawing Sheets

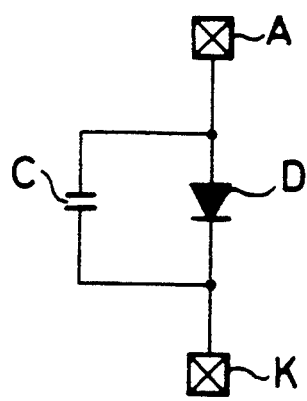
FIG.3
(PRIOR ART)
FIG.4A
(PRIOR ART)
Icj
FIG.4B
(PRIOR ART)
Iℓd
FIG.4C
(PRIOR ART)
ILD

019595

DRIVE CIRCUIT FOR SEMICONDUCTOR LIGHT-EMITTING DEVICE

BACKGROUND OF THE INVENTION

1. FIELD OF THE INVENTION

The present invention relates to a drive circuit for semiconductor light-emitting device. More specifically, this invention relates to a drive circuit for semiconductor light-emitting device which is applicable to a laser drive integrated circuit (IC) for high-speed switching used for, for example, magneto-optical disks and laser beam printers.

2. DESCRIPTION OF THE RELATED ART

FIG. 1 shows a laser drive circuit categorized as a cathode-common type circuit as known in the prior art. In FIG. 1, a component 1 is a base current source for determining the drive current to the laser semiconductor, which is ordinarily controlled so that the output voltage which is the quantity of laser light may be regulated to be a designated value by monitoring the quantity of laser light from the laser light-emitting device by means of a photo-diode not shown. Components 2 and 3 form a current mirror circuit composed of a couple of P-channel MOS transistors, where both of the drain and source terminals of the PMOS transistor 2 are connected to the base current source 1. The value of the drain current to the PMOS transistor 2 is reflected (mirrored) to the value of the output current from the PMOS transistor 3.

The drain terminal of the PMOS transistor 3 is connected to the terminal shorted both to the collector and base of the NPN transistor 4. The base of the NPN transistor 5 is connected to the terminal shorted both to the collector and base of the NPN transistor 4. With these NPN transistors 4 and 5, a current mirror circuit is formed. By making the ratio of the area of the emitter of the NPN transistor 4 to the area of the emitter of the NPN transistor 5 is 1:N, the value of the output current from the emitter terminal common to the transistors 4 and 5 may be obtained so as to be (1+N) times as large as the value of the drain current to the PMOS transistor 3.

A component 7 is a laser diode, and its cathode is connected to the ground level point (GND) 9, while its anode is connected the common-emitter terminal of the NPN transistors 4 and 5. The N-Channel MOS transistor 6 is a switching transistor which is turned on when the high-level signal is applied to the control signal input terminal, and to which the current supplied from the PMOS transistor 3 is led. In this state, a current is not supplied to the short-circuit terminal to the collector and base of the NPN transistor 4, and thus the current mirror circuit formed by the NPN transistors 4 and 5 is turned off. Therefore, the drive current for the laser diode 7 is zero. In addition, as the NMOS transistor 6 is turned off when the low-level signal is applied to the input terminal 10, the output current from the PMOS transistor 3 drives the laser diode 7 by driving the current mirror circuit composed of the NPN transistors 4 and 5. And then, the light emission from the laser diode 7 is switched in a high speed by turning the NMOS transistor 6 on and off in a high speed.

FIG. 2 shows another example of the semiconductor laser drive circuit as known in the prior art. In FIG. 2, the cathode of the laser diode 30 is connected to the lower electric potential terminal 22 in the circuit, and its anode is connected to the current mirror circuit 24. The input terminal to the current mirror circuit 24 is connected to the output terminal from the constant-current circuit 23. The emitter of the NPN transistor 25 which is switched by the control signal supplied from outside the circuit to terminal 32 is connected to the lower electric potential terminal 22, and its base is connected to the control signal input terminal 32 and its collector is connected to the output terminal from the constant-current circuit 23.

In the circuit shown in FIG. 2, the semiconductor laser diode 30 emits laser light in responsive to the current supplied to itself. Its light emission process is stated as below. At first, when the voltage applied to the control signal input terminal 32 is $V_H$, the NPN transistor 25 is turned on and the current supplied by the constant-current source 23 is led to the NPN transistor 25 and is not supplied to the current mirror circuit 24 and hence as the current is not also supplied to the laser diode 30, and the laser light is not emitted.

Next, when the voltage applied to the control signal input 32 is $V_L$, the NPN transistor 25 is turned off and the current supplied by the constant-current source 23 is led to the current mirror circuit 24 and hence, as the current is also supplied to the laser diode 30, and the laser light is emitted from the laser diode 30. At this time, the electric potential at the base of the current mirror circuit 24 is the sum of the voltage $V_F$ defined between the anode and the cathode of the laser diode 30 and the voltage $V_{BE(ON)}$ defined between the emitter and the base of the current mirror circuit 24.

However, in the prior art shown in FIG. 2, as the charge current for charging the junction capacitance in the laser diode, the following disadvantages are found.

(1) When the laser diode is turned on after a long period of time while which the laser diode is turned off, spike noises occur at the rise-up part of the waveform of the current supplied to the anode terminal of the laser diode.

(2) The turn-on speed of the current when the laser diode is turned on after a longer period of time during which the laser diode is turned off is slower than the turn-on speed of the current when the laser diode is turned on after a shorter period of time during which the laser diode is turned off.

The factors leading to the above disadvantages (1) and (2) are described below.

FIG. 3 shows an equivalent circuit of the laser diode 7. In FIG. 3, A is the anode terminal, K is the cathode terminal, D is the junction part of the laser diode, and C is the junction capacitance of the laser diode. In case that the laser drive circuit shown in FIG. 1 drives the laser diode 7, the current is led to the laser diode junction part D when the voltage $V_F$ defined between the terminals of the laser diode rises to about 1 to 1.5 V. That is, the drive current in the laser drive circuit is at first used for charging the junction capacitance C, and when $V_F$ rises up to the voltage at which the laser light can be emitted from the laser diode, the fraction of the current used for charging the junction capacitance C is reduced and the effective current is led to the junction part D of the laser diode.

FIGS. 4A–4C show waveforms of currents supplied into the laser diode shown in FIGS. 1 and 2. The waveform (FIG. 4A) in FIG. 4 refers to the current Icj led to the junction capacitance C, the waveform (FIG. 4B) refers to the current Ild led to the laser diode junction part D, and the waveform (FIG. 4C) refers to the current ILD led to the anode terminal A. In the time domain, the current ILD led to the anode terminal A is the sum of Icj and Ild, and hence, the peak of the waveform of the current Icj used for charging the junction part D makes a noise on the current ILD led to the anode terminal A.

Next, the factor leading to the above disadvantage (2) is described below.

FIGS. 5A–5D show waveforms of currents and voltage with the turn-off time period of the laser diode shown in FIGS. 1 and 2 changed. In this figure, the waveform (FIG. 5A) refers to the laser drive current ILD led to the anode terminal A of the laser diode 7, the waveform (FIG. 5B) refers to the voltage $V_F$, the waveform (FIG. 5C) refers to the charge current Icj for charging the laser diode junction capacitance C, and the waveform (FIG. 5D) refers to the current Ild led to the junction part D of the laser diode.

Individual waveforms show differences in the time-domain behavior in responsive to the change of the turn-off time period of the drive current of the laser diode.

The pulse P1 in the waveform in FIG. 5A is a step response of the laser drive current when the laser diode is driven after a long time Toff1 during which the laser diode has been turned off. That is, Toff1 is far greater than Toff2. As shown in the waveform in FIG. 5B, while the time period Toff1 during which the laser diode is turned off in a long time, the electric charge stored in the laser diode junction capacitance C is almost discharged with a small quantity of Off current, and hence, $V_F$ goes down to the GND level. Therefore, the additional current is required for charging the laser diode junction capacitance C when the laser diode is turned on next, and the charge current flows in the waveform in FIG. 5C. Eventually, the current led to the anode terminal A takes a step response shaped in the pulse P1 containing a noise in its rise-up part.

As for the pulse P2 formed after a short period Toff2 after the fall-down of the pulse P1, as the laser diode is turned on before the electric charge stored in the laser diode junction capacitance C is fully discharged, the voltage $V_F$ does not fall down to the GND level at the beginning of the pulse P2 as shown in the waveform in FIG. 5B, and the charge current shown by FIG. 5C flows a little. Therefore, the current ILD led to the anode terminal A does not contain noises. In addition, as the pulse P2 does not need the current Icj, the turn-on speed of the pulse P2 is faster than the pulse P1.

In summing up, in the laser drive circuit in the prior art shown in FIG. 1, after a long period of time during which the laser diode is turned off, a spike noise is contained in the laser current waveform in its rise time part, and its turn-on speed is restricted.

These disadvantages described above are found in another prior art shown in FIG. 2. Parasitic capacitors are formed at the output terminal of the constant-current circuit 23, the collector of the switching NPN transistor 25, and the collector and base of the current mirror circuit 24, and individual parasitic capacitors are charged by the output current from the constant-current circuit 23 when the switching NPN transistor 25 is transferred from the turn-off state to the turn-on state. And then, a designated quantity of current is led to the current mirror circuit 24 when the electric potential at the base of the current mirror circuit 24 rises up from $V_{CE(SAT)}$ to $V_F + V_{BE(ON)}$, and finally, the laser diode 30 emits laser light with its intensity determined in responsive to the current led to the laser diode.

Due to the time constant developed in the time domain behavior for charging the above described capacitances, the laser diode 30 emits laser light with a delayed time after the voltage applied to the control input terminal 32 changes from $V_H$ to $V_L$. Especially, in case of reducing the output current from the constant-current circuit 23 in order to reduce the output power of laser light, the delayed time for emitting laser light is remarkable and can not be ignored for attaining the high-speed switching response of the laser light.

SUMMARY OF THE INVENTION

An object of the present invention is to provide a drive circuit enabling a high-speed switching response in semiconductor light emitting devices and removing noises from its drive current.

In the first aspect of the present invention, drive circuit of a driving object for supplying a constant drive current to the driving object, comprises:
  input means for inputting a control signal;
  constant driving current generating means for generating the constant driving current;
  switching means for switching a supply of the constant driving current to the driving object in accordance with the control signal inputted by the input means; and
  means for supplying a current to the switching means in response to an input of the control signal representing a turn-on before the driving object is actually driven.

Here, the driving object may be a semiconductor light emitting device.

The semiconductor light emitting device may be a semiconductor laser device.

The switching means may comprise a transistor.

The switching means may comprise a current mirror circuit having a plurality of transistors.

The switching means may further comprise means for switching the current mirror circuit in accordance with the control signal inputted by the input means.

The supplying means may be a level shift circuit.

The level shift circuit may comprise one or more diodes.

The level shift circuit may comprise one or more emitter follower transistors.

The level shift circuit may comprise one or more source follower transistors.

The control signal inputted by the input means may be supplied to both the supplying means and the switching means; and
  an inverter may be provided between input means and the supplying means, or between the input means and the switching means.

The drive circuit may further comprise a delay circuit between the input means and the switching means.

In the second aspect of the present invention, a driver integrated circuit comprises:
  means for generating a drive current;
  means for switching an output of the drive current to an output terminal; and
  means for generating a bias current,
  in which the bias current generated by the bias current generating means is supplied to the output terminal independent at a state of the switching means.

Here, the bias-current generating means may comprise a resistor.

The bias current generating means may comprise current mirror transistors.

The driver integrated circuit may drive a semiconductor light emitting element.

The above and other objects, effects, features and advantages of the present invention will become more apparent from the following description of embodiments thereof taken in conjunction with the accompanying drawings.

BRIEF DESCRIPTION OF THE DRAWINGS

FIG. 3 is an equivalent circuit of the laser diode;

FIGS. 4A–4C are waveforms showing currents supplied into the laser diode shown in FIGS. 1 and 2;

DESCRIPTION OF THE PREFERRED EMBODIMENTS

Figure 1:
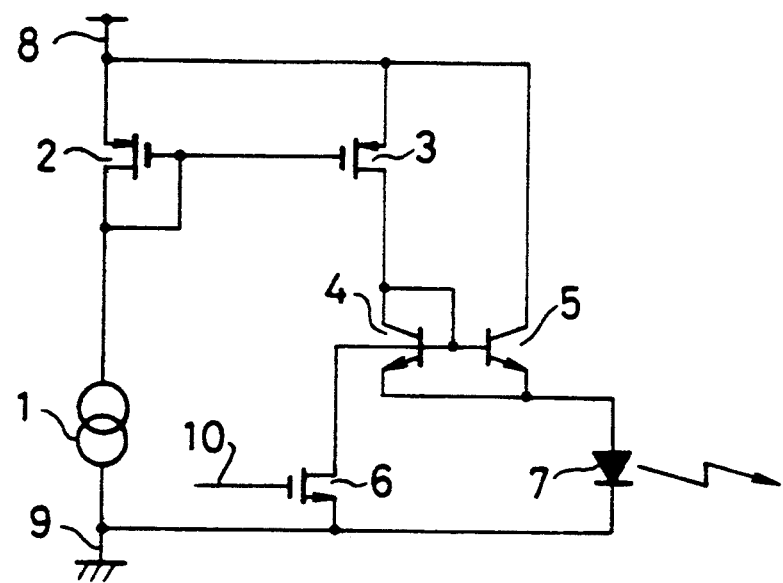
FIG. 1 is a circuit diagram showing a prior art drive circuit for laser diodes of a cathode common type.
Figure 6:
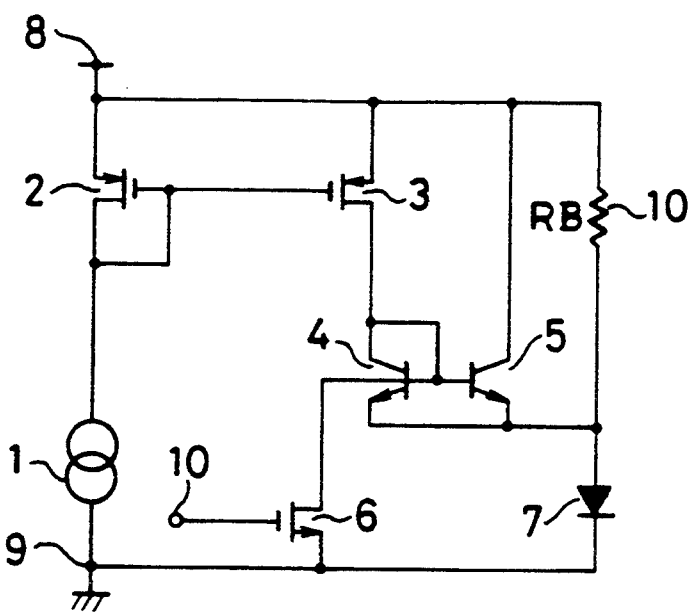
FIG. 6 is a circuit diagram showing the first embodiment of the present invention.

FIG. 6 shows the first embodiment of the present invention. This circuit is a driver IC for driving a laser diode 7. In FIG. 6, a component 1 is a base current source for defining the drive current of laser, components 2 and 3 are defined as a current mirror circuit formed by PMOS transistors, and components 4 and 5 are defined as a current mirror circuit formed by NPN transistors. A component 6 is an N-channel MOS transistor for switching a drive current. An input terminal 10 for ON/OFF switching of control signals is connected to the gate of the NMOS transistor 6. A terminal 8 accepts the power supply VCC, and numeral 9 indicates a ground point (GND). As the principles of operations by each of components designated numerals 1 to 6,8 and 9 are similar to the prior art described in FIG. 1, these are not repetitively described here.

The laser diode drive current is put out from the common terminal to emitters of NPN transistors 4 and 5, and is supplied to the anode terminal of the laser diode 7. The cathode terminal of the laser diode 7 is connected to the GND 9. The resistance 10 for defining a bias current, which is specific to this driver IC, is connected to the anode terminal of the laser diode 7. The other terminal of the resistance 10 for defining a bias current is connected to the power supply VCC 8.

A bias current defined by the following equation is supplied through the resistance 10 for defining a bias current to the anode terminal of the laser diode 7 when the laser is turned off.

$$I_{bais} = \frac{V_{CC} - V_{F(OFF)}}{R_S} \quad (1)$$

where $V_{F(OFF)}$ is $V_F$ of the laser diode when it is turned off, and $R_B$ is the value of the resistance for defining a bias current.

As for Ibias, its value is determined so that the laser diode may not emit light.

Figure 7:
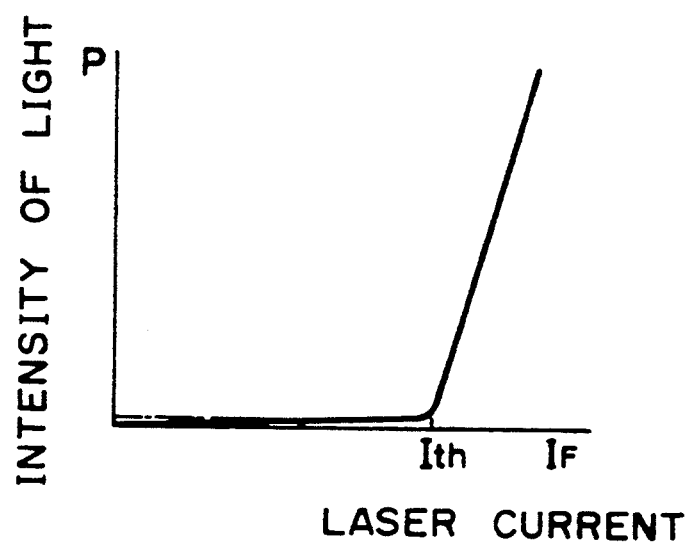
FIG. 7 is a characteristic curve showing a relationship between the intensity of light from a laser diode and a drive current of the laser diode.

FIG. 7 shows a relationship between the intensity of light emitted from the laser diode and the drive current. As shown in FIG. 7, in the range where the laser current IF is less than the threshold current Ith, the laser output power P is extremely small, and, in the range where the laser current IF gets over Ith, the laser output power P increases rapidly as the laser current IF increases.

By charging the junction capacitance into the laser diode while the laser is turned off with Ibias being adjusted so as to be less than Ith, which means that Ibias is so selected that the apparatus within which the laser diode is installed may not be given bad influences, and by regulating the charge current, when the laser diode is turned on from its turned-off state, to such a small value that it does not depend upon the turn off time of the laser, it will be appreciated that spike noises can be removed and that the degradation of the rise-up time can be reduced.

Figure 8A:
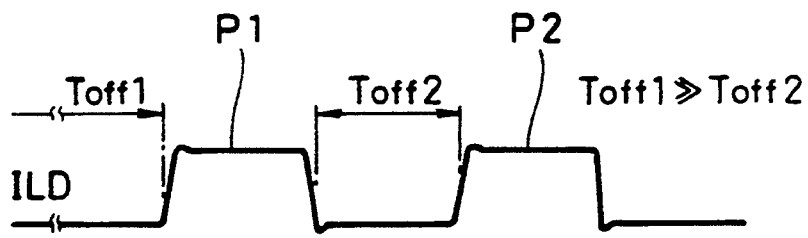
FIGS. 8A–8D are waveforms showing currents supplied into the laser diode 7 shown in FIG. 6.

FIGS. 8A–8D show waveforms observed when Ibias is supplied to the laser diode 7. FIG. 8A shows the current ILD running into the anode terminal. Suppose that the turn-off time of the laser before the pulse P1 is turned on is Toff1, and that the turn-off time of the laser before the pulse P2 is turned on is Toff2, then the relationship, Toff1>>Toff2, is established.

Figure 8B:
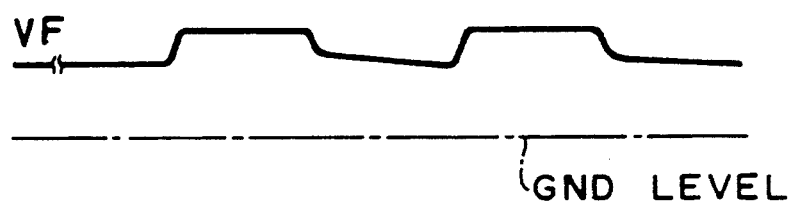
Figure 8C:
Figure 8D:

Even in the time period, Toff1, while the laser is turned off in a relatively long time, the voltage VF developed at the laser diode 7 does not fall down to the GND level as shown in FIG. 8B. This is because the junction capacitance is charged by Ibias, and thus a designated quantity of electric charge is not lost in the laser diode 7. Therefore, the charge current Icj flowing through the junction part of the laser diode does not change even if Toff changes, but is kept to be an extremely small value independent of Toff as shown in FIG. 8C. Thus, as the current ILD to the anode terminal is defined to be the sum of the charge current Icj and the laser diode junction part current Ild as shown in FIG. 8D, it can be avoided that spike noises occur simultaneously at the turn-on part of the current waveform, and the degradation of the turn-on time can be reduced.

Figure 9:
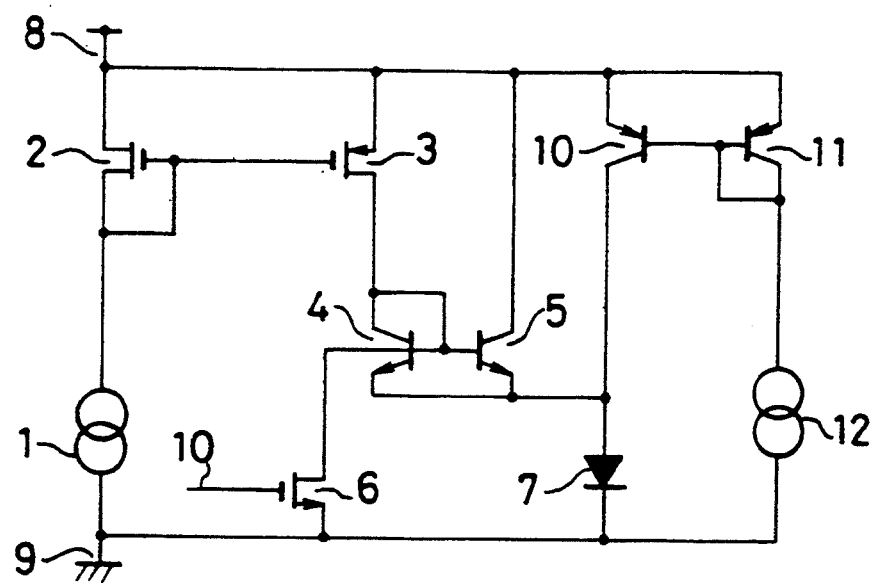
FIG. 9 is a circuit diagram showing the second embodiment of the present invention.

FIG. 9 shows the second embodiment of the present invention. This embodiment is a driver IC like the first embodiment, but the laser current is supplied by a current mirror circuit instead of the resistance 10 for defining the bias current of the first embodiment shown in FIG. 6. In FIG. 9, the collector of the PNP transistor 10 is connected to the anode terminal of the laser diode 7, and the base of the PNP transistor 10 is connected to the collector-base short terminal of the PNP transistor 11. The emitters of the PNP transistors 10 and 11 are connected to the power supply $V_{CC}$ 8, and furthermore, the base of the PNP transistor and the collector-base short terminal of the PNP transistor 11 are connected to the constant-current source 12.

Therefore, if the ratio of the area of the emitter of the PNP transistor 10 to the area of the emitter of the PNP transistor 11 is 1, the value of the current from the constant-current source 12 is reflected to the current supplied from the collector of the PNP transistor 10 to the anode terminal of the laser diode 7. This current is established as a bias current for charging the junction capacitor of the laser diode. As a result, as explained above with FIG. 8, it can be avoided that spike noises occur simultaneously at the rise-up part of the current waveform, and the degradation of the rise-up time can be reduced, both of which are caused by the change of the turn-off time period of the laser diode.

As the bias current is generated within the driver IC, the number of devices outside of the driver IC can be reduced.

Figure 10:
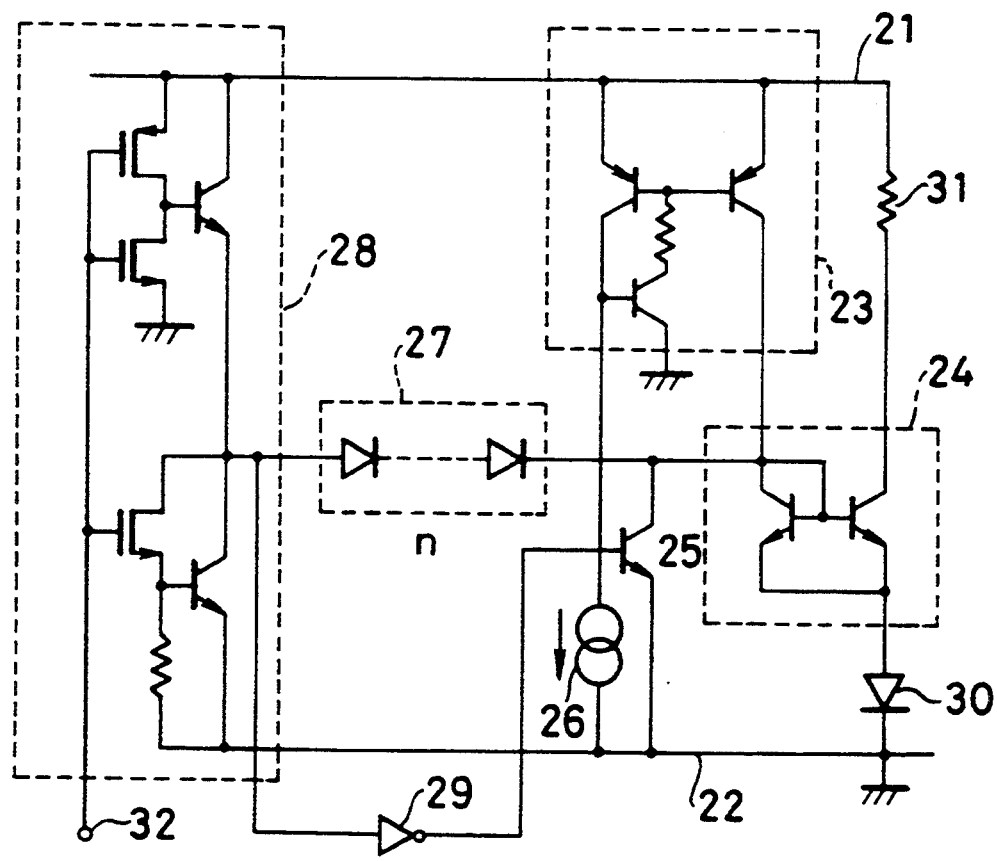
FIG. 10 is a circuit diagram showing the third embodiment of the present invention.

FIG. 10 shows the third embodiment of the present invention. Following embodiments are preferably structured by IC. In FIG. 10, a component 21 is a power supply line, a component 22 is a ground line, a component 23 is a constant-current circuit, a component 24 is a current mirror circuit, a component 25 is an NPN transistor for switching, a component 26 is a current source, a component 27 is a level shift circuit using diodes, a component 28 is a BicMOS inverter, a component 29 is an inverter, a component 30 is a semiconductor laser diode, and a component 32 is an input terminal for control signals.

Next, what is described is an operation of the circuit in the third embodiment.

When the voltage applied to the control signal input terminal 32 is $V_H$, the output from the inverter 28 is lower voltage, and therefore, the output from the inverter 29 is high voltage designated $V_{OH}$. The NPN transistor 25 is turned on and the current supplied by the constant-current source 23 is led to the NPN transistor 25 and is not supplied to the current mirror circuit 24, and therefore, as the current is not supplied to the laser diode 30, the laser light is not emitted.

At this time, as the difference of electric potentials between both end terminals of the level shift circuit 27 is not found, the diode is in a zero-biased state and the current does not flow in the diode.

Next, in case that the voltage applied to the control signal input terminal 32 is $V_L$, the output from the inverter 29 is lower voltage, and therefore, the output from the inverter 29 is high voltage. Therefore, in order to turn off the NPN transistor 25 for switching from its turn-on state, the output current supplied by the constant-current circuit 23 begins to be supplied to the current mirror circuit 24, and at the same time, as the output from the inverter 28 is high voltage, this voltage is transferred through the level shift circuit 27 to the electric potential of the base of the current mirror circuit 24, and thus the base potential is suddenly raised.

Figure 2:
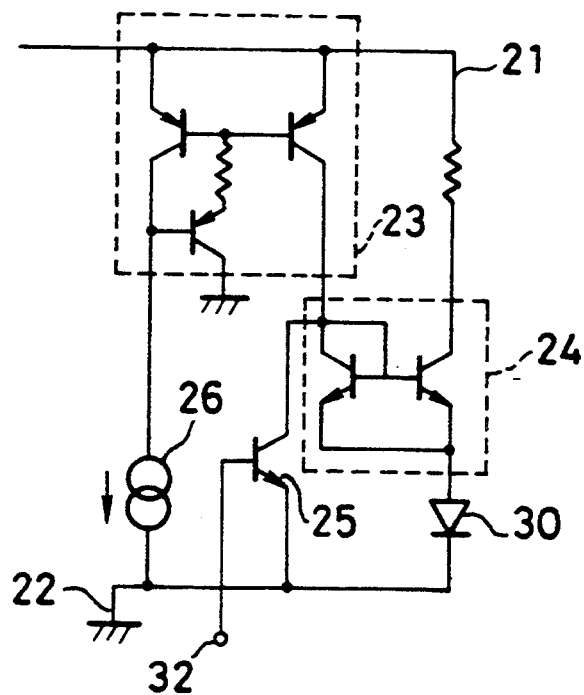
FIG. 2 is a circuit diagram showing another embodiment.
Figure 5A:
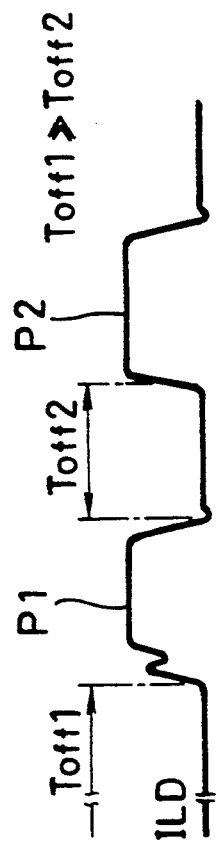
FIGS. 5A–5D are waveforms showing currents supplied into the laser diode shown in FIGS. 9 and 10.
Figure 5B:
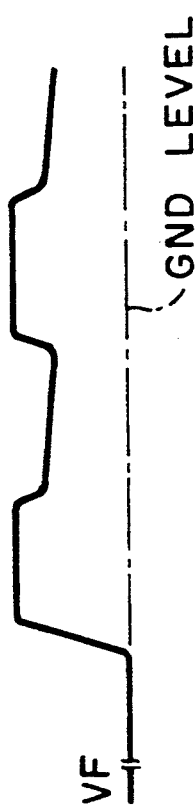
Figure 5C:
Figure 5D:
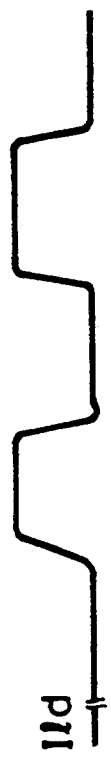

The above base potential has the value $V_{CH} - {_n}V_{DF}$ which is subtracted the value ${_n}V_{DF}$ from the output of the inverter 28, in which ${_n}V_{DF}$ is obtained by multiplying the number (n) of the diodes serially connected in the level shift circuit 27 by the forward potential ($V_{DF}$) of the diode. In order that the value $V_{CH} - {_n}V_{DF}$ has a somewhat lower value than the value $V_{BE(ON)} + V_F$ in the prior art (see FIG. 2), the value of n or the junction area of the diode must be adjusted. As compared with the time necessary for charging the parasitic capacity by using the output current of the constant current circuit 23 of the prior art shown in FIG. 2 and then causing the base potential of the current mirror circuit 24 to be the value $V_{BE(ON)} + V_F$, in the present embodiment, the above time is very short. Accordingly, it becomes possible to switch at a high speed the laser light emission.

When the control input terminal is at low potential, the output potential of the level shift circuit is smaller than the value $V_{BE(ON)} + V_F$ as described above. Therefore, since the diodes in the level shift circuit are in a zero-biased state or reverse-biased state when the output current of the constant current circuit 23 flows into the current mirror circuit 24 and the desired current is supplied to the laser diode 30, the current does not flow into the laser diode 30, it never effects the setting of the driving current to the laser diode 30 by the current source 26.

Figure 11:
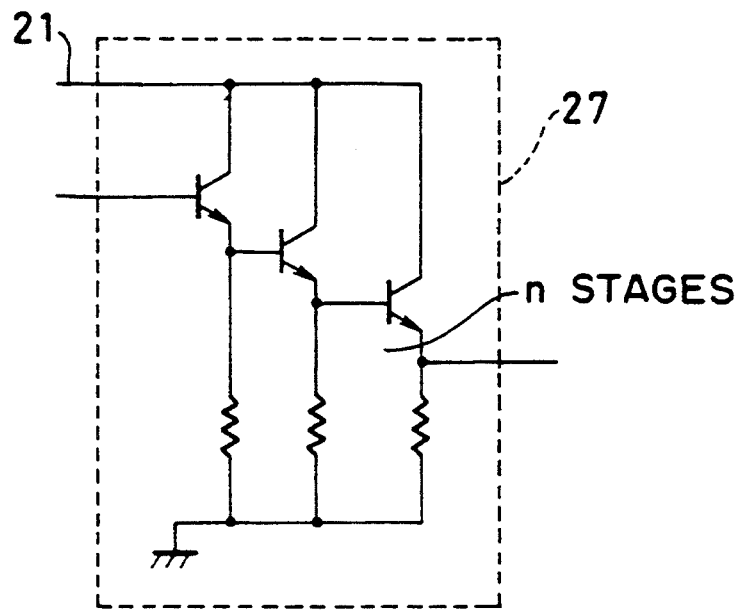
FIG. 11 is a diagrammatical picture showing a multi-stage emitter follower circuit using NPN transistors as another embodiment of the level shift circuit 27 shown in FIG. 10.
Figure 12:
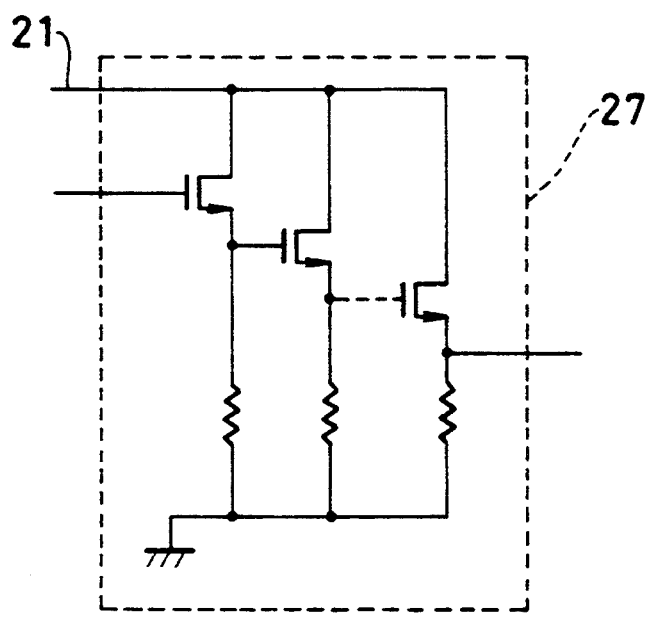
FIG. 12 is a diagrammatical picture showing a multi-stage emitter follower circuit using NMOS transistors as another embodiment of the level shift circuit 27 shown in FIG. 10.

FIGS. 11 and 12 are embodiments which modify the embodiment shown in FIG. 10. Namely, it may be possible to use an n-stage emitter follower as shown in FIG. 11 or an n-stage source follower as shown in FIG. 12.

Figure 13:
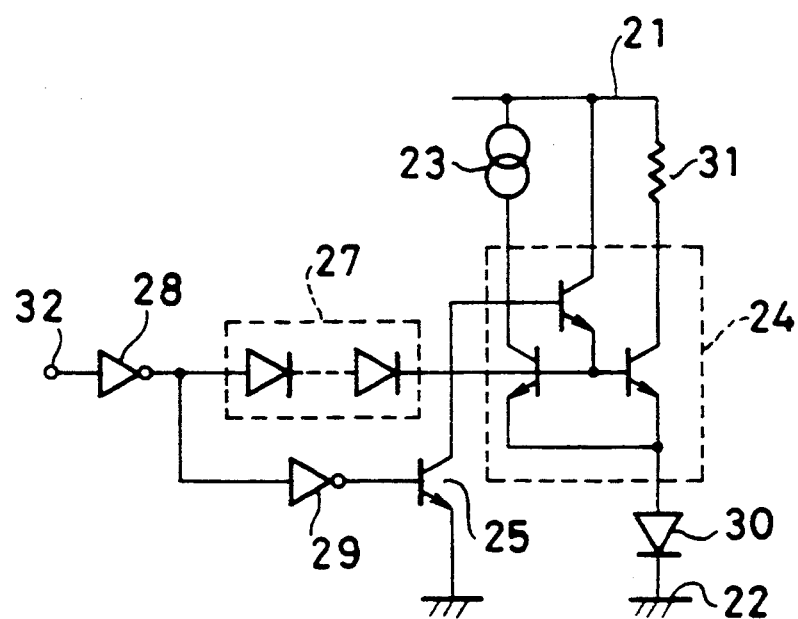
FIG. 13 is a circuit diagram showing a modification of the embodiment shown in FIG. 10.

The fifth embodiment shown in FIG. 13 is fundamentally the same as one in FIG. 10, except that an ordinary inverter is used as the inverter 28 in this embodiment. Namely, any ordinary drivers which has a lower output impedance may be used as the inverter 28.

In the embodiment shown in FIG. 13, the current source 26 shown in FIG. 10 is removed and the current source is directly connected as the constant current circuit 23.

Figure 14:
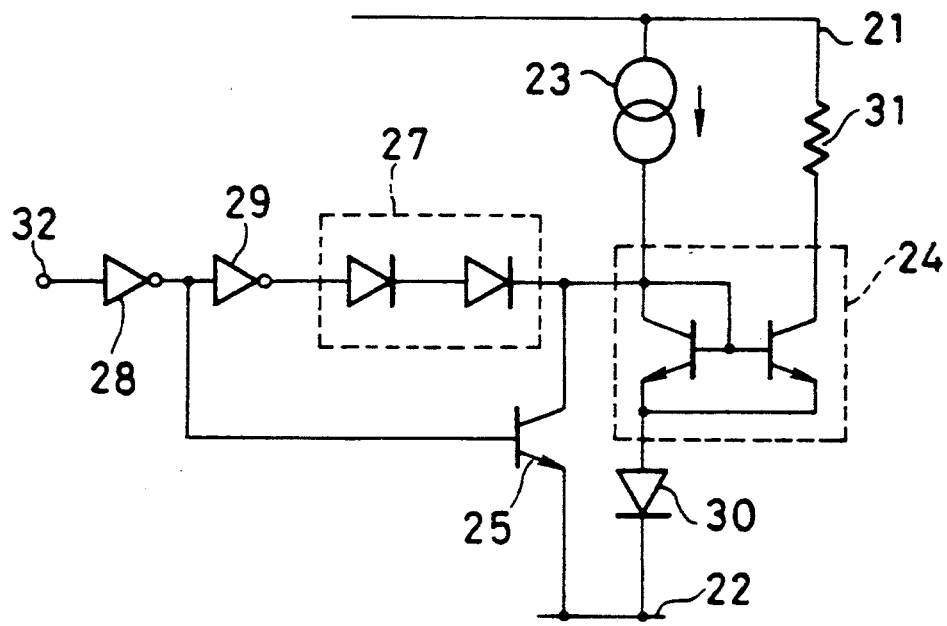
FIG. 14 is a circuit diagram showing the sixth embodiment of the present invention.

FIG. 14 shows another embodiment of the present invention. In FIG. 14, a cathode of a laser diode 30 is connected to a lower potential point 22 in a circuit, an anode of the diode is connected to a current mirror circuit 24 of which an input is connected to an output of a constant current circuit 23. The lower electric potential point 22 is connected to an emitter of an NPN transistor 25 which can be switched by a control signal, a base of the NPN transistor 25 is an output of a level shift circuit 27 of which an input is connected to an output of a voltage driver.

In operation, an output of an inverter 28 is at a high potential when a control input terminal is at a lower potential $V_L$. Therefore, an output of an inverter 29 and the output of the level shift circuit 27 are turned into a lower potential. As a result, the switching transistor 25 is turned on to draw an output current of the constant current source 23. Accordingly, since no current can be supplied into the laser diode 30, it does not emit light.

Next, when a control input terminal 32 is turned into the high potential $V_H$, the output of the inverter 28 is turned into the lower potential. As a result, the switching transistor 25 switched from its turned-on state to its turned-off state, so that the output current of the constant current source 23 begins to flow into the current mirror circuit 24. The output of the inverter 29 becomes the high potential just after the current flowing. Thus the level shift circuit 27 becomes conductive and the output current of one is supplied to the current mirror circuit 24. As a result, a base potential of the current mirror circuit 24 is suddenly raised, and then the current mirror circuit 24 gradually supplies a current to the laser diode 30. When the magnitude of the supplied current becomes larger than a predetermined threshold value, the laser diode begins to emit the light.

This embodiment also has the same effects as that in the embodiment described above.

However, it takes the inverter 29 and the level shift circuit 27 a certain time td to obtain the maximum value of the output current of the level shift circuit 27 from when the control input terminal 32 changes from the low potential to the high potential and the switching transistor 25 switches from the turned-on state to the turned-off state. Accordingly, if the laser driver is driven at a higher frequency, it may be necessary to take account of the time td.

Next, another embodiment of the present invention will be explained, in which a delay element is inserted between an input terminal of the voltage driver switched by the control input and an input terminal of an active element switched by the control input, the effect of an operation delay time of the voltage driver and the level regulation means is eliminated by operating the voltage driver before the active element is switched, it is, therefore, possible to minimize the time from when the active element is switched from the turned-on state to the turned-off state to when the current mirror circuit 24 begins to supply a current to the laser diode.

Figure 15:
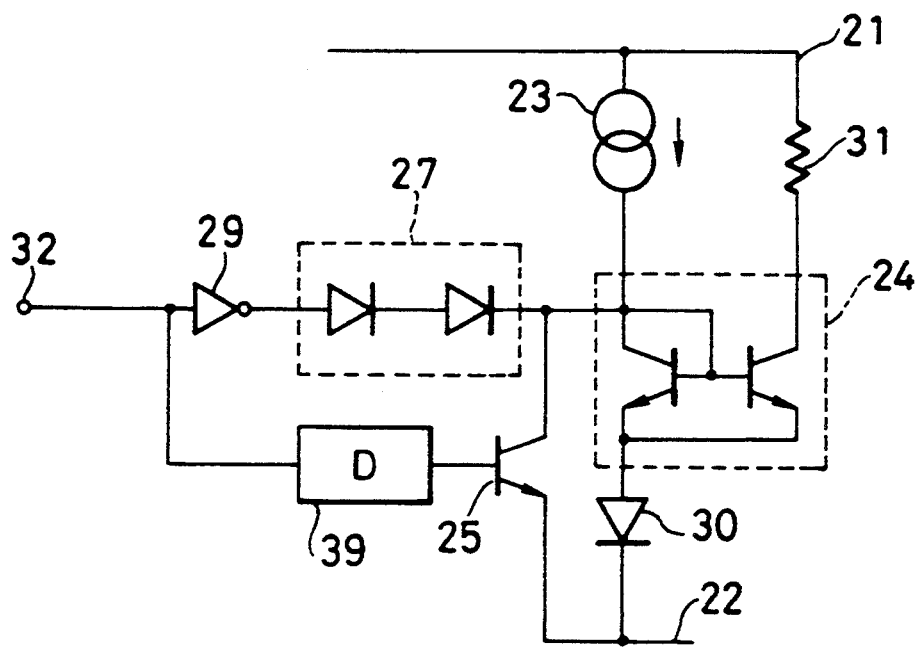
FIG. 15 is a circuit diagram showing the seventh embodiment of the present invention.

FIG. 15 shows the seventh embodiment of the present invention in which like elements corresponding to those of the above embodiment are identified by the same reference numerals, and the explanation of the like elements will be abbreviated.

In this embodiment, a delay element 39 is inserted between an input of an NPN switching transistor and the control input terminal.

Figure 16:
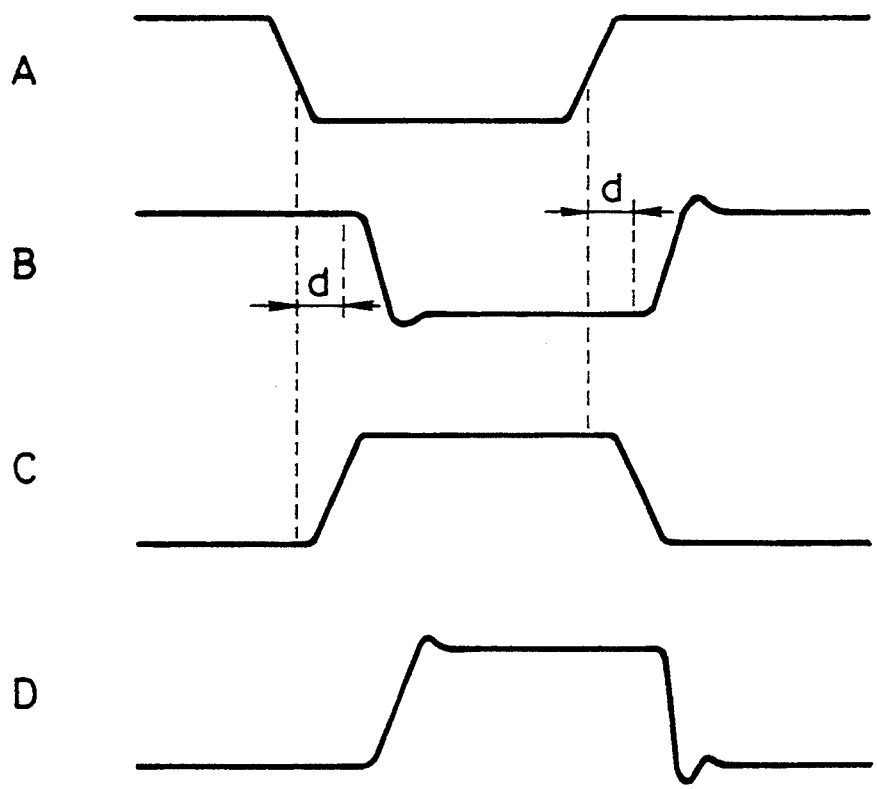
FIG. 16 is a waveform showing voltages and currents measured at each node in the seventh embodiment.

In operation, when the control input terminal 32 is at a high potential $V_H$, an output of the delay element 39 is also at a high potential. Thus the switching transistor 25 is at the turned-on state and the output current of the constant current source 23 flows thereinto. At this time, since the output of the inverter 29 is at the low potential, the level shift circuit 27 does not provide the output current. Therefore, any current are not supplied to the current mirror circuit 24 and thus the laser diode 30, as result, the laser diode does not emit the light. Next, referring to FIG. 16, the operation when the control input terminal 32 changes to the low potential will be explained.

In the figure, each symbols indicate as follows;
A: a waveform of the control signal input terminal;
B: a base waveform of the switching transistor 25;
C: an input waveform of the level shift circuit 27;
D: a cathode current of the laser diode 30; and
d: delay time of the inverter 29.

When the control input terminal changes from the high potential to the low potential, an input waveform of the level shift circuit 27 changes to the high potential after the delay time of the inverter 29 elapses. The base of the switching transistor changes to the low potential after the delay time of the delay element 39, its collector current decrease along with change in the base current.

At this time, since the output of the level shift circuit 27 is already at the high potential, the current is supplied at a high speed from the output of the level shift circuit 27 to the input of the current mirror circuit 24, and thus the base potential of the current mirror circuit 24 is also raised at a high speed. When the base potential of the current mirror circuit 24 rises just before the value which can supply a desired current to the laser diode 30, the level shift circuit 27 changes from a forward bias, and thus it does not supply the output current. Therefore, the current supplied to the input of the current mirror circuit 24 is only the output current of the constant current source 23, in which the laser diode 30 is driven by the constant current with the set value.

By using such the delay element 39, it is possible to decrease very much the time from when the switching transistor 25 switches from the turned-on state to the turned-off state to when the set current is supplied to the laser diode 30, and it is also possible to drive it at a high speed.

As described hereinbefore, in the present invention, since a bias current always flows to an anode terminal of the semiconductor light emitting element, it is possible to precharge a junction capacity of the semiconductor light emitting element, and thus it is possible to eliminate the charge current of the junction capacitance without regard to the length of the turned-off time of semiconductor light emitting device. As a result, spike noises in the rising part and the deterioration of the rising speed of the waveform which depend on the turned-off time of a semiconductor light emitting device, are suppressed.

Since it can charge at a high speed a parasitic capacitance accompanying such as a semiconductor emitting element and a current mirror circuit for driving it just before the turned-on state of the current mirror circuit, by using the voltage driver and the level regulating means, it is possible to allow the semiconductor light emitting device to emit the light and stop emitting it at a high speed without effecting the setting of the current flowing to the semiconductor light emitting device.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A drive circuit of a driving object for supplying a constant drive current to the driving object, comprising:
    input means for inputting a control signal;
    constant driving current generating means for generating the constant driving current;
    switching means for switching a supply of the constant driving current to the driving object in accordance with the control signal inputted by said input means; and means for supplying a current to said switching means in response to an input of the control signal representing a turn-on before said driving object is actually driven.

2. A drive circuit as claimed in claim 1, wherein said driving object is a semiconductor light emitting device.

3. A drive circuit as claimed in claim 2, wherein said semiconductor light emitting device is a semiconductor laser device.

4. A drive circuit as claimed in claim 1, wherein said switching means comprises a transistor.

5. A drive circuit as claimed in claim 1, wherein said switching means comprises a current mirror circuit having a plurality of transistors.

6. A drive circuit as claimed in claim 5, wherein said switching means further comprises means for switching said current mirror circuit in accordance with the control signal inputted by said input means.

7. A drive circuit as claimed in claim 1, wherein said supplying means is a level shift circuit.

8. A drive circuit as claimed in claim 7, wherein said level shift circuit comprises one or more diodes.

9. A drive circuit as claimed in claim 7, wherein said level shift circuit comprises one or more emitter follower transistors.

10. A drive circuit as claimed in claim 7, wherein said level shift circuit comprises one or more source follower transistors.

11. A drive circuit as claimed in claim 1, wherein the control signal inputted by said input means is supplied to both said supplying means and said switching means; and an inverter is provided between input means and said supplying means, or between said input means and said switching means.

12. A drive circuit as claimed in claim 11, further comprising a delay circuit between said input means and said switching means.

13. A driver integrated circuit comprising:

means for generating a drive current;

means for switching an output of the drive current to an output terminal; and a transistor, one terminal of which is connected to said output terminal, wherein a high level voltage is supplied to another terminal of said transistor so that a bias current is supplied to the output terminal independent of a state of said switching means.

14. A driver integrated circuit as claimed in claim 13, wherein said driver integrated circuit drives a semiconductor light emitting element.

15. A driver integrated circuit comprising:

means for generating a drive current;

means for switching an output of the drive current to an output terminal; and current mirror transistors for generating a bias current, wherein the bias current generated by said current mirror transistors is supplied to the output terminal independent of a state of said switching means.

16. A driver integrated circuit as claimed in claim 15, wherein said driver integrated circuit drives a semiconductor light emitting element.

* * * * *

UNITED STATES PATENT AND TRADEMARK OFFICE
CERTIFICATE OF CORRECTION

PATENT NO. : 5,349,595

DATED : September 20, 1994

INVENTOR : KATSUHISA OGAWA, ET AL.

It is certified that errors appear in the above-identified patent and that said Letters Patent is hereby corrected as shown below:

[57] ABSTRACT

Line 9, "on" should read --of--; and

Line 14, "dependent" should read --dependence--.

COLUMN 1

Line 6, should read: --1. Field of the Invention--;

Line 14, should read: --2. Description of the Related Art--

Line 39, "is" should be deleted; and

Line 50, "terminal," should read --terminal 10,--.

COLUMN 2

Line 19, "and" should be deleted; and

Line 35, "while" should read --during--.

COLUMN 3

Line 20, "responsive" should read --response--.

COLUMN 4

Line 2, "sponsive" should read --sponse--;

Line 4, "above described" should read --above-described--; and

Line 67, "at" should read --of--

UNITED STATES PATENT AND TRADEMARK OFFICE
CERTIFICATE OF CORRECTION

PATENT NO. : 5,349,595

DATED : September 20, 1994

INVENTOR : KATSUHISA OGAWA, ET AL.

It is certified that errors appear in the above-identified patent and that said Letters Patent is hereby corrected as shown below:

COLUMN 6

Line 16, "$$Ibais = \frac{V_{CC} - V_{F(OFF)}}{R_S} \quad (1)$$" should read $$--\ Ibias = \frac{V_{CC} - V_{F(OFF)}}{R_B} \quad (1)--; \text{ and}$$

Line 40, "turn off" should read --turn-off--.

COLUMN 7

Line 33, "IC." should read --IC techniques.--; and

Line 61, "29" should read --28--.

COLUMN 8

Line 4, "subtracted the" should read --subtracted from the--;

Line 8, "Of" should read --of--;

Line 38, "drivers" should read --driver--; and

Line 66, "switched" should read --switches--.

COLUMN 9

Line 26, "input, the" should read --input. The--;

Line 30, "switched, it" should read --switched. It--;

UNITED STATES PATENT AND TRADEMARK OFFICE
CERTIFICATE OF CORRECTION

PATENT NO. : 5,349,595

DATED : September 20, 1994

INVENTOR : KATSUHISA OGAWA, ET AL.

It is certified that errors appear in the above-identified patent and that said Letters Patent is hereby corrected as shown below:

COLUMN 9, (cont'd.)

Line 50, "any current are not" should read --no current is--;

Line 51, "diode 30, as" should read --diode 30. As--;

Line 56, "each" should be deleted; and

Line 68, "decrease" should read --decreases--.

COLUMN 10

Line 15, "such" should be deleted.

COLUMN 12

Line 4, "input" should read --said input--.

Signed and Sealed this

Thirtieth Day of May, 1995

Attest:

*Attesting Officer*

BRUCE LEHMAN

*Commissioner of Patents and Trademarks*